United States Patent
Chen et al.

(10) Patent No.: US 8,125,233 B2
(45) Date of Patent: Feb. 28, 2012

(54) PARAMETRIC TESTLINE WITH INCREASED TEST PATTERN AREAS

(75) Inventors: Hsien-Wei Chen, Sinying (TW); Shih-Hsun Hsu, Hsin-Chu (TW); Hao-Yi Tsai, Hsin-Chu (TW); Shin-Puu Jeng, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 12/704,252

(22) Filed: Feb. 11, 2010

(65) Prior Publication Data

US 2010/0164521 A1 Jul. 1, 2010

Related U.S. Application Data

(62) Division of application No. 11/811,135, filed on Jun. 8, 2007, now Pat. No. 7,679,384.

(51) Int. Cl.
*G01R 31/26* (2006.01)

(52) U.S. Cl. ........... 324/750.3; 324/755.09; 324/755.11; 324/762.02

(58) Field of Classification Search .................. None
See application file for complete search history.

(56) References Cited

U.S. PATENT DOCUMENTS

| | | | |
|---|---|---|---|
| 5,051,690 A | 9/1991 | Maly et al. | |
| 6,605,825 B1 | 8/2003 | Brar et al. | |
| 6,873,146 B2 | 3/2005 | Liu | |
| 7,164,149 B2 | 1/2007 | Matsubara | |
| 2004/0164418 A1* | 8/2004 | Sugiura et al. | 257/758 |

FOREIGN PATENT DOCUMENTS

CN 1295746 C 1/2007

\* cited by examiner

*Primary Examiner* — Minh N Tang
(74) *Attorney, Agent, or Firm* — Slater & Matsil, L.L.P.

(57) ABSTRACT

An integrated circuit parametric testline providing increased test pattern areas is disclosed. The testline comprises a dielectric layer over a substrate, a plurality of probe pads over the dielectric layer, and a first device under test (DUT) formed in the testline in a space underlying the probe pads. The testline may also include a second DUT, which is formed in a space underlying the probe pads overlying the first DUT in an overlaying configuration. The testline may further include a polygon shaped probe pad structure providing an increased test pattern area between adjacent probe pads.

20 Claims, 7 Drawing Sheets

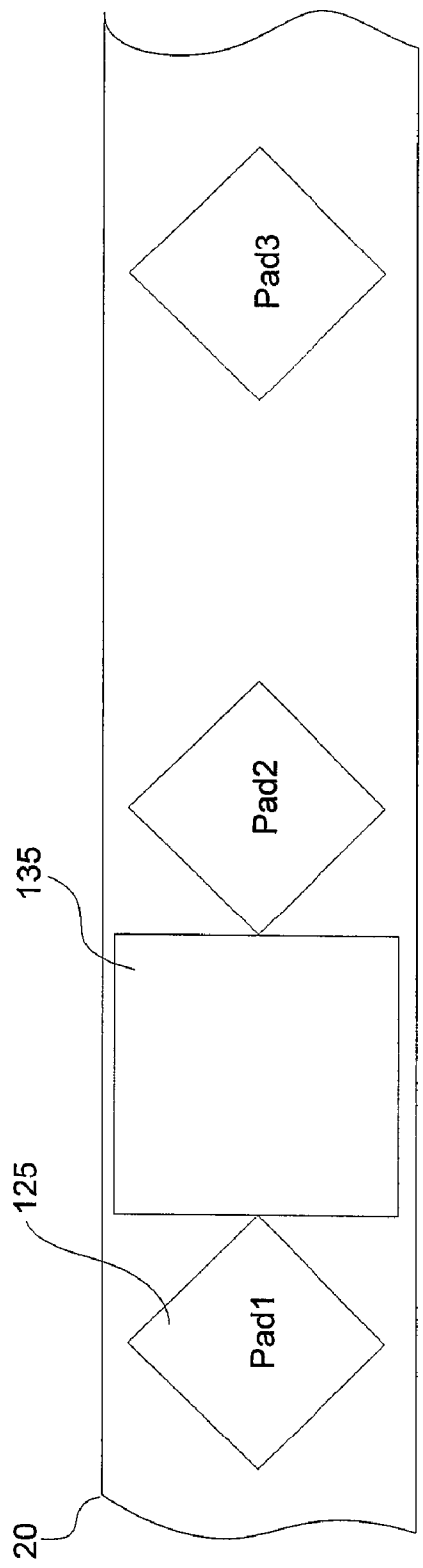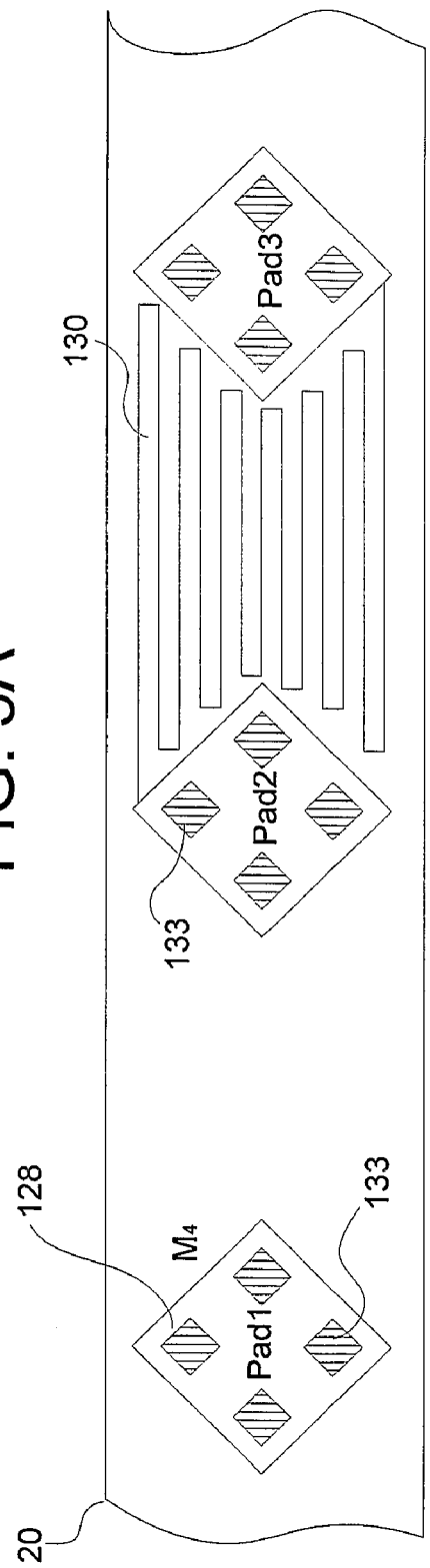

PARAMETRIC TESTLINE WITH INCREASED TEST PATTERN AREAS

This application is a divisional of and claims the benefit of U.S. patent application Ser. No. 11/811,135, filed on Jun. 8, 2007, entitled "Parametric Testline with Increased Test Pattern Areas," now U.S. Pat. No. 7,679,384, which application is hereby incorporated herein in its entirety by reference.

TECHNICAL FIELD

The present invention relates generally to the testing of integrated circuits, and more particularly to the structure of parametric testline on an integrated circuit wafer substrate for wafer acceptance testing (WAT), process control monitoring (PCM) and other R&D testing needs.

BACKGROUND

In integrated circuit (IC) manufacturing, a semiconductor wafer typically contains a plurality of testlines in the scribe line area between adjacent wafer dies. Each testline includes a number of devices under test (DUTs), which are structures similar to those that are normally used to form the integrated circuit products in the wafer die area. DUTs are usually formed in the test pattern areas between adjacent probe pads on a testline at the same time as the functional circuitry using the same process steps. Probe pads are usually flat, square metal surfaces on a testline through which test stimuli can be applied to corresponding DUTs. Parametric test results on DUTs are usually utilized to monitor, improve and refine a semiconductor manufacturing process. Yield of test structures on a testline is often used to predict the yield of functional integrated circuitries in the die area.

Shown in FIG. 1A is a plan view of a portion of a semiconductor wafer substrate layer 5 on which conventional parametric testlines are formed. A parametric testline 20 is formed in a scribe line area 10 between adjacent wafer dies 15. Each testline is made up by a serial number of aligned probe pads. Each probe pad 25 has a square shape and may be made from metal or other electrically conductive materials. Probe pads on a testline are electrically connected to a plurality of DUTs 30 formed between adjacent probe pads beneath the probe pad layer. Pluralities of test lines with different DUTs are formed in scribe line areas across the substrate. The DUTs 30 are test structures in the form of resistors, capacitors, inductors, diodes, transistors, or the like, designed to measure device parameters, such as MOSFET Vt, contact/via chain resistance, sheet capacitance, gate oxide breakdown voltage, and the like. By studying these parameters, it is possible to monitor, improve and refine a semiconductor production process.

FIG. 1B is a schematic cross-section view of a portion of an exemplary parametric testline 20 along the longitudinal direction AA' as shown in FIG. 1A. To avoid repetition, like numerals and letters used in FIG. 1A will be used for the various elements in the coming figures. Also, reference numbers described in FIG. 1A may not be described again in detail herein. As illustrated in FIG. 1B, a conventional parametric testline 20 is generally composed of two major parts. The first part is a generic framework testline structure, as shown in a cross-section view, in correspondence with a certain technology generation. This part of the testline structure comprises a substrate layer 5, an insulating layer 8 formed atop the substrate layer 5 and a plurality of probe pads 25 of identical shape formed with the same pad pitch on the top surface of insulating layer 8. Each probe pad 25 is electrically connected to an underlying stacking via structure, which comprises a square shaped metal piece on each metal layer coupled to each other through one or more vias. A probe pad structure (a probe pad 25 and the stacking via structure formed thereunder) is separated from an adjacent probe pad structure by insulating material 8. This part of the testline structure defines testline parameters such as line length, line width, probe pad size, probe pad pitch, test pattern size, and so on. The second part of a testline structure consists of a plurality of DUTs 30, for example the R (resistance) and C (capacitance) shown in the schematic view in FIG. 1B, which are formed in the test pattern areas between adjacent probe pads 25 on a testline 20. This part of the testline structure differentiates one testline from another through DUTs 30 designed to monitor different process parameters or to evaluate different device structures and circuit products. In practice, a layout of a generic framework testline structure is first provided to a testline designer. The testline designer will then "customize" the generic framework structure by "plugging" customized DUTs into the predefined framework, using the predetermined size of a test pattern area as a physical constraint. In FIG. 1B, a DUT 30 in the form of a doped silicon substrate sheet resistor R is "plugged" into the test pattern area between pad 1 and pad 2 and is electrically connected to the M1 (first metal layer) piece of pad 1 and the M1 piece of Pad 2. As another example, a DUT 30 in the form of a capacitor C, which is designed to measure the M3 to M2 dielectric leakage current, is "plugged" into the test pattern area between pad 2 and pad 3 and is electrically connected to the M2 piece of pad 2 and the M3 piece of pad 3.

Following the continuous scale down in device feature sizes in an integrated circuit in order to meet the increasing demand of integrating more complex circuit functions on a single chip, a similar trend had been urged upon the size and structure of a parametric testline. That is the area of a testline line must shrink with each technology generation to facilitate more wafer areas for functional integrated circuitries. As an example, when semiconductor processing technology upgrades from 130 nm technology node to 90 nm technology node, a typical test pattern area on a prior art parametric test line has decreased from about 8000 μm² to about 3500 μm², a reduction of more than 50%. This trend will continue with greater magnitude while technology updating continues. As a result, at a certain point, the size of a test pattern area on a prior art parametric testline will become too small to accommodate certain types of DUTs.

On the other hand, the continuing scale-down of device feature sizes and increased circuit complexity in an integrated circuit has imposed new demands on the existing parametric testline structure. One of these demands is that testlines corresponding to advanced processing technology must include a large amount of test structures of different types and dimensions to meet the test needs for advanced semiconductor devices and complex integrated circuits. Another demand comes from the need of design-for-manufacturability (DFM) in advanced technology, where much more testing resources are needed on a testline in order to analyze the correlation of a specific layout style to a process yield and obtain a preferred set of layout style leading to a predictable manufacturing yield. A further demand on a parametric testline comes from the semiconductor process R&D field, where a large number of test resources are required to conduct extensive design-on-experiment (DOE) and statistical split activities critical in reaching a process flow of high manufacturing yield in advanced technology. The demands mentioned above are all calling for testlines capable of offering more test pattern areas and to accommodate more DUTs of various types and dimensions.

In view of the trends described above and other issues facing a conventional parametric testline and the ever increasing testing tasks demanded by advanced technologies, there is a need for improved testline structures capable of housing more DUTs and DUTs of various dimensions on a shrunk testline area.

SUMMARY OF THE INVENTION

These and other problems are generally solved or circumvented, and technical advantages are generally achieved, by preferred embodiments of the present invention which provide parametric testline structures where device under test (DUT) can be formed in a testline space underneath one or more probe pad structures. In preferred embodiments, a DUT can also be formed overlying another DUT in an overlaying configuration, and a probe pad structure may be rotated to a certain orientation creating a larger test pattern area on a testline.

In accordance with one preferred embodiment of the present invention, an integrated circuit testline structure comprises a substrate, a dielectric layer formed atop the substrate, a first, second, and third probe pad formed atop the dielectric layer, and a device under test (DUT), wherein said DUT is formed in the testline structure in a space underlying the first, second, and third probe pad.

In accordance with another preferred embodiment of the present invention, an integrated circuit testline structure comprises a substrate, a dielectric layer formed atop the substrate, a first, second, and third probe pad formed atop the dielectric layer, and a first and second DUT. The first DUT is then formed in the testline structure in a space underlying the first, second, and third probe pad. The second DUT is formed in the testline structure in a space underlying the first and second probe pads overlying the first DUT.

In accordance with yet another preferred embodiment of the present invention, an integrated circuit parametric testline comprises a substrate, a dielectric layer formed atop the substrate, a first probe pad formed on the dielectric layer, and a first stacking via structure formed under and coupled to the first probe pad. The first stacking via structure comprises a metal layer having an edge not parallel to the edges of the parametric testline.

Several advantageous features are provided by preferred embodiments of the present invention. These include significant improvements on testline space utilization. The designed structure of a conventional parametric testline only allows a DUT being formed in a test pattern area between adjacent probe pads. The parametric testline structure of this invention allows large size DUTs to be formed in a space underlying a plurality of probe pads. The parametric testline structure of this invention also allows DUTs to be formed in a stacking configuration. Moreover, comparing to the square or rectangular probe pad shape and pad orientation in a prior art testline, the probe pad shapes and orientation in preferred embodiments can be altered so that a test pattern area between adjacent probe pads can be maximized to accommodate DUTs of large sizes. As a result, more DUTs and DUTs of various shape and dimensions can be formed in a shrunk testline of the current invention.

BRIEF DESCRIPTION OF THE DRAWINGS

For a more complete understanding of the present invention, and the advantages thereof, reference is now made to the following descriptions taken in conjunction with the accompanying drawings, in which:

FIG. 5A is a plan view of a portion of a parametric testline in accordance with yet another embodiment of the current invention;

FIG. 5B shows an underlying plan of the embodiment in accordance with FIG. 5A.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely innovative parametric testline structures for wafer acceptance testing (WAT). The preferred embodiments of the present invention include testline structures offering larger test pattern areas in order to accommodate more DUTs and DUTs with large dimensions. The invention may also be applied to benefit other activities, such as process control monitoring (PCM), yield analysis, statistical split, design-of-experiment (DOE), and design-for-manufacturability (DFM), and the like.

Figure 1A:
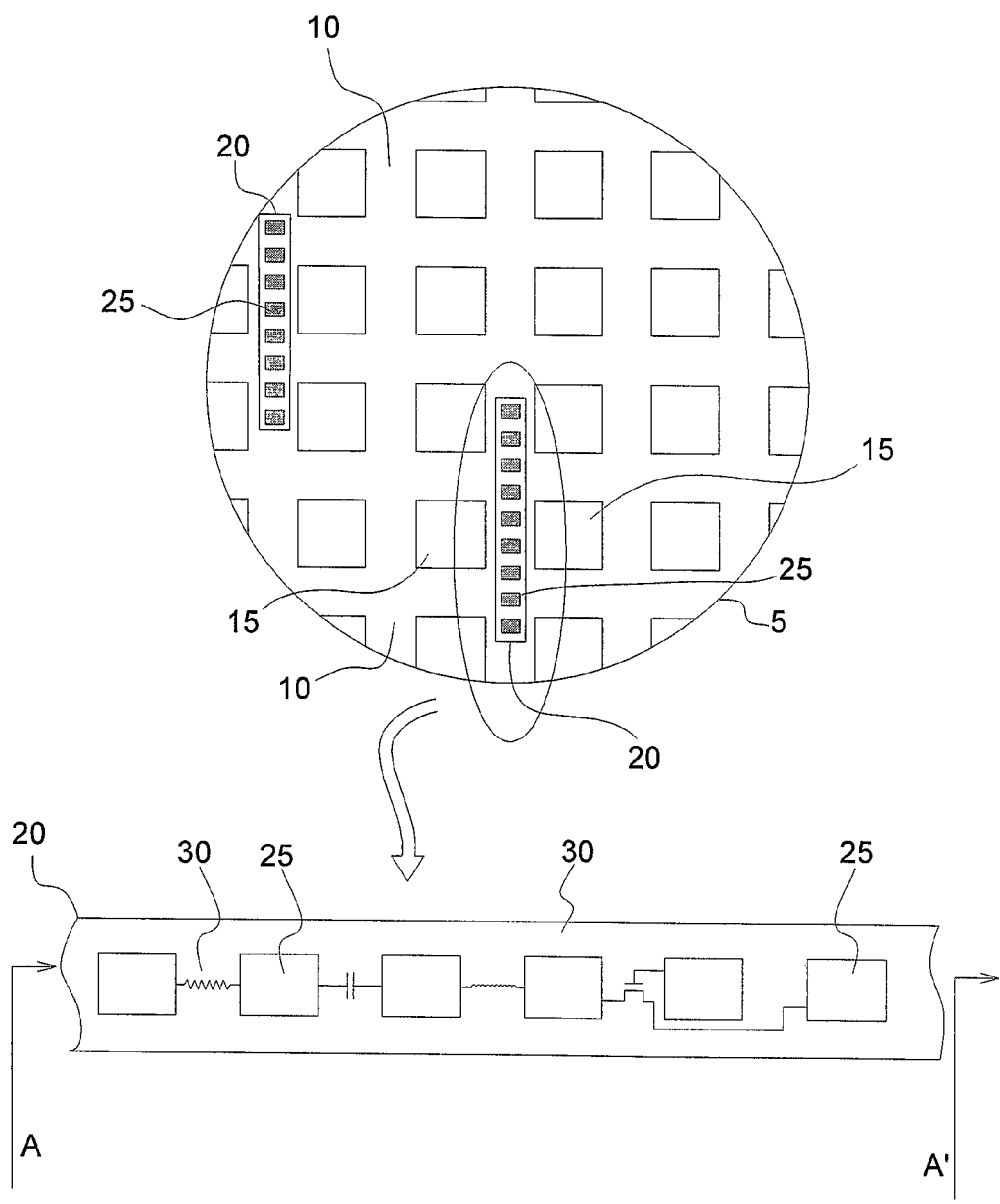
FIG. 1A is a plan view of a conventional parametric testline formed on a semiconductor wafer substrate.
Figure 1B:
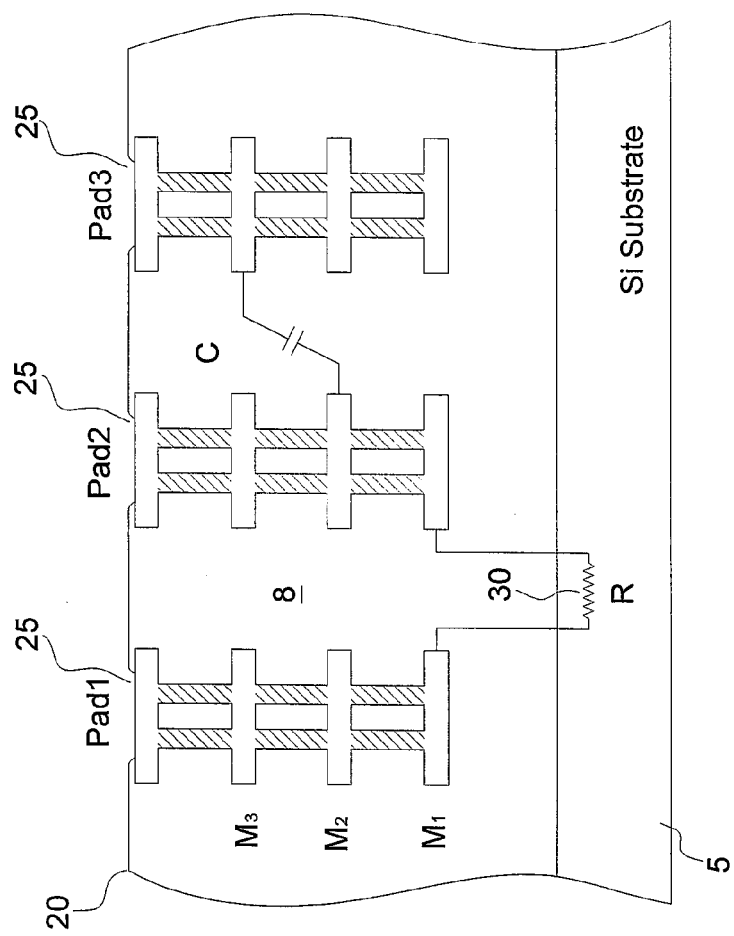
FIG. 1B shows a schematic cross-section view of a portion of a conventional parametric testline.
Figure 2A:
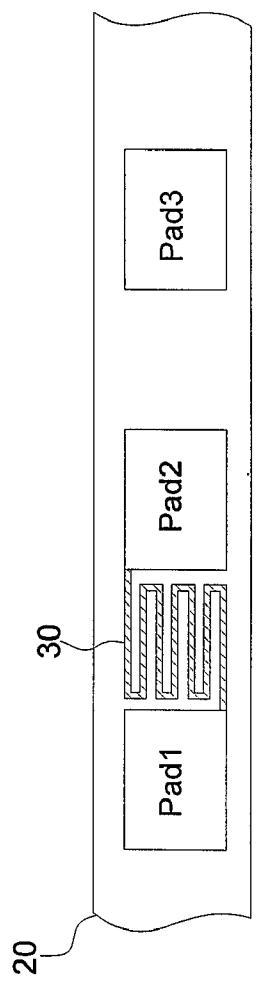
FIG. 2A is plan view illustrating a DUT arrangement in a conventional parametric testline.

Shown in FIG. 2A is a plan view illustrating a DUT arrangement in a conventional parametric testline as shown in FIGS. 1A-1B. In FIG. 2A, an exemplary DUT 30 in the form of a serpentine resistor is formed in a test pattern area between probe pad 1 and probe pad 2 of testline 20. The serpentine resistor 30 is made by conductive materials used in devices in a functional integrated circuitry, such as metal, metal alloy, or doped polysilicon, and is electrically connected to pad 1 and pad 2. By measuring the sheet resistance of DUT 30, one can readily determine whether a device comprising a similar structure made by the same material in an integrated circuitry, formed in the wafer die area, will exhibit desired resistance value. As mentioned earlier, however, when the dimension of a parametric testline 20 is downsized following the trend of feature size scaling down on a semiconductor wafer, there gets to a point where fitting a DUT into a shrunk test pattern area is no longer possible and a new testline structure offering a larger test pattern area on a shrunk testline must be developed. It is worth emphasizing that, when technology upgrading continues, the need of integrating large size devices in an integrated circuitry is more realistic than trivial because the types and variety of semiconductor devices in an advanced integrated electronic system increase dramatically. Therefore, testline structure capable of accommodating large size DUTs in a shrunk testline provides practical meanings.

Figure 2B:
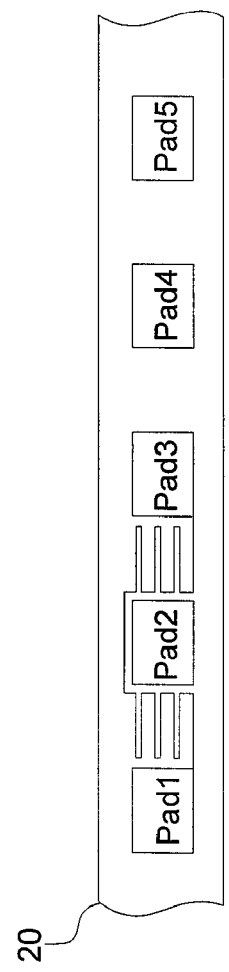
FIG. 2B illustrates a prior art approach of accommodating a large size DUT on a shrunk testline.

FIG. 2B illustrates one example of prior art testline structures aiming to address this issue. In the solution provided in FIG. 2B, the exemplary DUT of the serpentine resistor 30, as shown in FIG. 2A, is divided into two segments connected between pad 1 and pad 3 through a bypass trace surrounding pad 2 in order to fit into available test pattern areas in a shrunk testline. However, as can be appreciated by those skilled in the art, this approach only provides a partial solution and creates new problems. For example, this testline structure offers no advantage when a large size DUT in the form of a capacitance, inductance or ring oscillator is needed on a testline. Similar division will change the DUT configuration and may cause significant test errors. Besides, testline structure formed by this scheme accommodates fewer DUTs.

Figure 3:
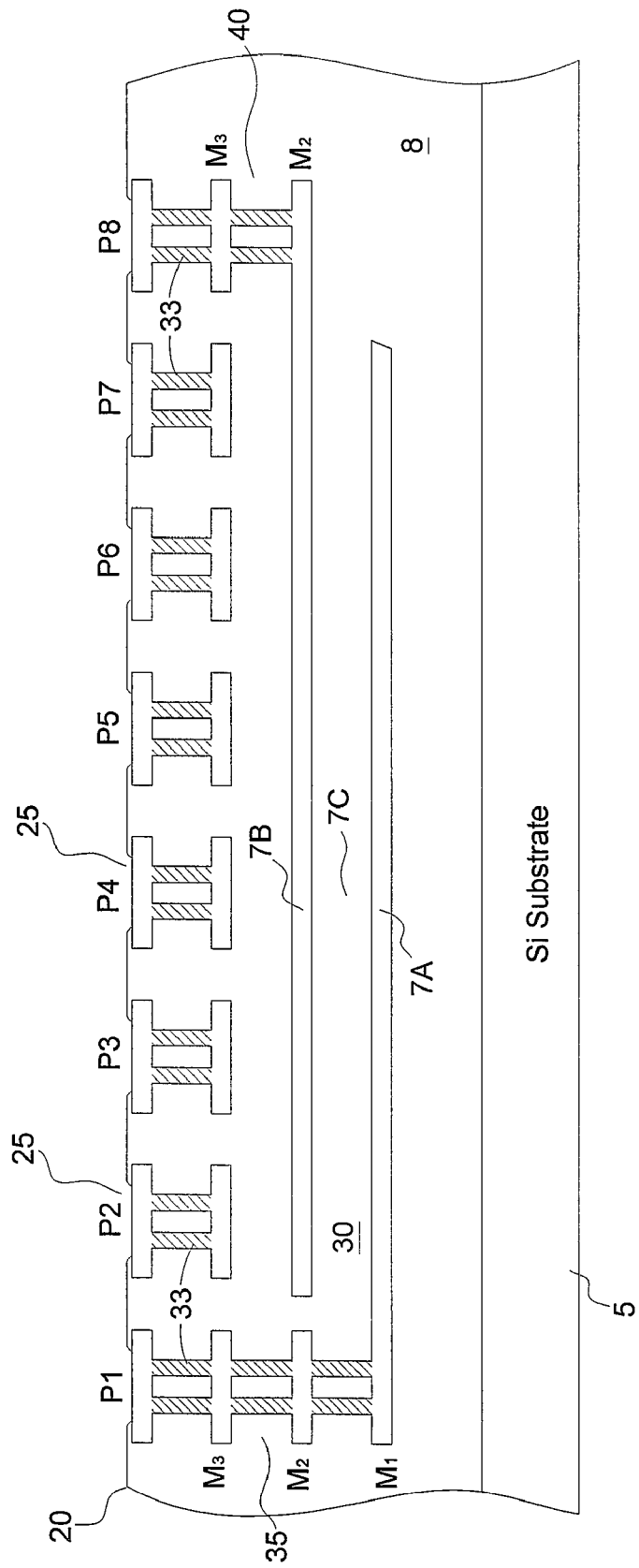
FIG. 3 shows a portion of a cross-section view of one preferred embodiment.

FIG. 3 shows a portion of a cross-section view along the longitudinal direction of a parametric testline 20 in one preferred embodiment of the current invention. In the current embodiment, measurement on the capacitance of a plate MOS capacitor 30 is conducted on a parametric testline 20 having a line width of about 50 μm, a line length of about 2000 μm, and a test pattern area of about 2000 μm² each. This plate MOS capacitor 30 is used for SPICE model CV (current vs. voltage) characterization and has a plate area of about 18000 μm² in an M1 metal plate-insulator-M2 metal plate (MIM) configuration. Testline 20 comprises a substrate layer 5 of P-type monocrystalline silicon having a low dopant concentration from approximately $10^{11}$ cm$^{-3}$ to approximately $10^{12}$ cm$^{-3}$. Alternatively, substrate layer 5 could be a semiconductor layer formed on an insulating layer (not shown) in a so-called silicon-on-insulator (SOI) wafer configuration. Testline 20 also includes electrically insulating material 8 formed atop substrate layer 5, which is used to provide a variety of advantageous features, such as preventing shorting of the various DUTs formed therein, providing dielectric material of a capacitor, forming an isolation layer in a DUT, and so on. The insulating material 8 is preferably formed from silicon dioxide (SiO$_2$), although other suitable dielectric materials such as silicon nitride (Si$_3$N$_4$), silicon carbide (SiC), and high dielectric constant materials can also be used for desired applications. Testline 20 further includes a plurality of aligned probe pads 25 formed atop the insulating layer 8. A probe pad 25 has a flat, square metal surface with a dimension of about 45 μm by 45 μm and its opposing edges are either parallel or perpendicular to the testline edges. A probe pad 25 is separated from adjacent probe pads by insulating material 8 with pitch dimension of about 100 μm.

A patterned region is formed in the first metal layer as a first metal plate 7A of capacitor 30. The first metal plate 7A, having a width of about 40 μm, extends from a location beneath a first probe pad P1, on the first metal layer under probe pads P2 through P6 along longitudinal direction, to a location beneath probe pad P7. The first metal plate 7A is electrically connected to probe pad P1 at one end through a stacking via structure 35, comprising a square M2 and M3 metal piece. The metal pieces are formed in insulating layer 8 in a stacking configuration, coupled to each other through one or more vias 33. In the current embodiment, plate 7A is made of copper (Cu), although other suitable conductive capacitor plate materials, such as aluminum (Al), tungsten (W) or metal/metal alloy materials are not excluded. Preferably, the opposing edges of said metal pieces are either parallel or perpendicular to the testline edges. Alternatively, one or more through-insulator-vias can be used to make direct electrical connection between probe pad 1 and the first metal plate 7A.

Similarly, a second plate 7B of capacitor 30 is formed in the second metal layer M2, separated from the first plate 7A formed in the first metal layer through a dielectric layer 7C having a thickness of from about 800 angstrom to about 2500 angstrom. In the current embodiment, plate 7B is made of copper (Cu), although other suitable conductive capacitor plate materials, such as aluminum (Al), tungsten (W) or metal/metal alloy materials are not excluded. Silicon dioxide is used to form the capacitor dielectric layer 7C, although other suitable dielectric materials, such as silicon nitride (Si$_3$N$_4$), silicon carbide (SiC) or other high dielectric constant materials are not excluded. The second plate 7B, having a width of about 40 μm, extends from a location on the dielectric layer 7C beneath a second probe pad P2, along a longitudinal direction under probe pads P2 through P7, to a location beneath probe pad P8, with longitudinal edges substantially aligned with those of the first plate 7A. The second plate 7B is electrically connected to probe pad P8 at one end through a stacking via structure 40, which comprises a square M3 metal piece formed in the insulating layer 8 in a stacking configuration, coupled to the second plate 7B and probe pad P8 through one or more vias 33. Preferably, the opposing edges of said metal pieces are either parallel or perpendicular to the testline edges. Alternatively, one or more through-insulator-vias can also be used to make direct electrical connection between probe pad P8 and plate 7B.

Upon completion of the MIM capacitor 30, CV measurement is carried out by applying test stimuli to the DUT via probe pads P1 and P8, and responses can be read on an integrated circuit tester. In one embodiment, probe pads P2 through P7 are each connected to an underlying M3 metal piece, and are electrically floating as shown in FIG. 3. As can be appreciated by those skilled in the art, the current embodiment fits a capacitor of large physical size into a shrunk testline without undesirable operations, such as changing probe pad pitches or altering device configurations, or the like.

Figure 4:
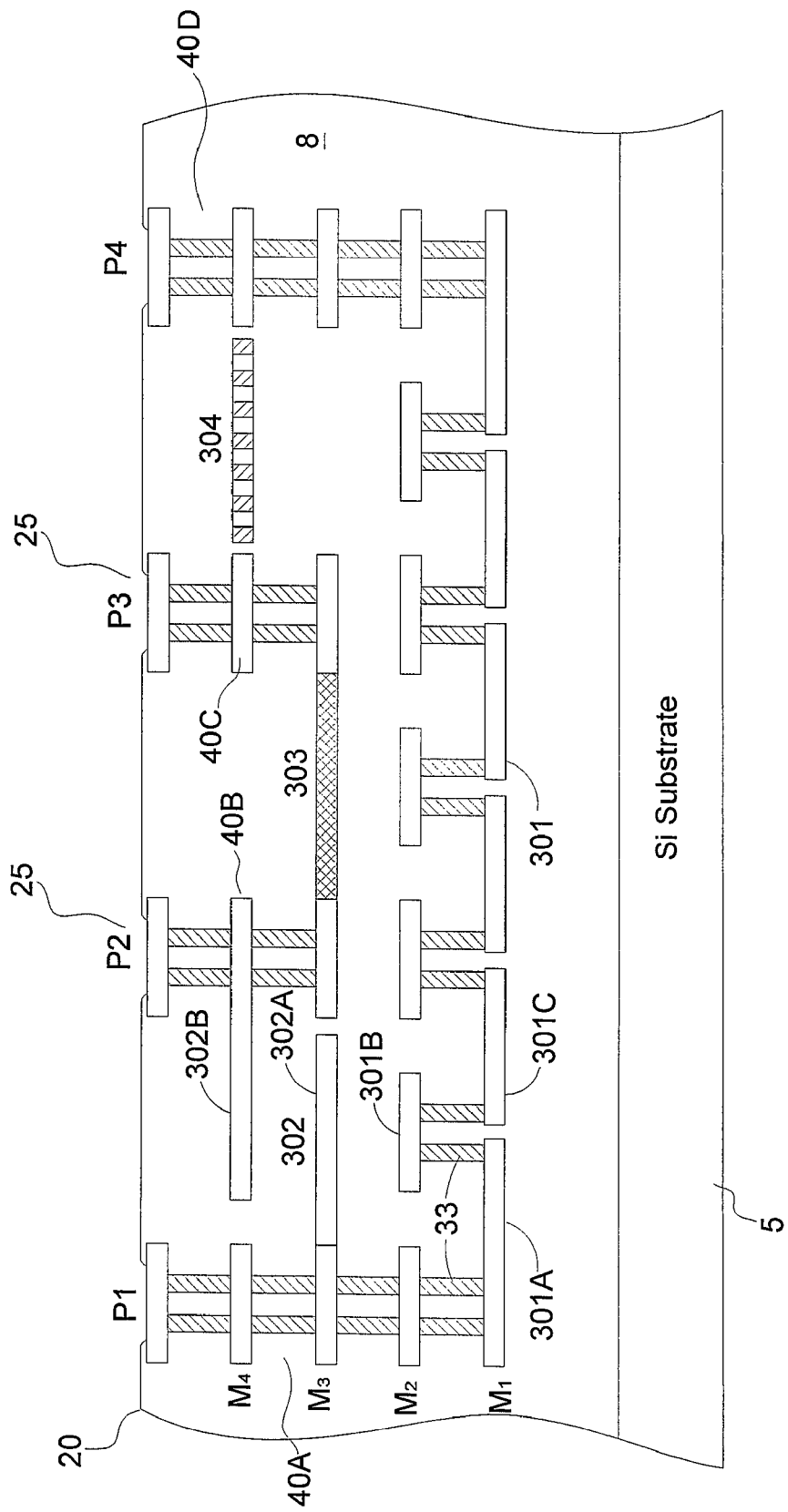
FIG. 4 is a portion of a cross-section view in accordance with another preferred embodiment of the current invention.

Shown in FIG. 4 is a portion of a longitudinal cross-section view of a parametric testline 20 in accordance with another preferred embodiment of current invention. In the current embodiment, the resistance of via 1 which is used to make electrical connection between the first metal layer M1 and the second metal layer M2 is measured on a testline 20. To conduct via 1 resistance measurement with desired test precision, a via chain comprising a plurality of via 1 is first formed between M1 and M2. Resistance of the via chain is measured and the resistance of an individual via 1 is estimated therfrom. In FIG. 4, a via chain comprising 500 via 1 is formed in a parametric testline 20 having a line width of about 50 μm, a line length of about 2000 μm, and a test pattern area of about 2000 μm² each. Since a test pattern area between two adjacent probe pads is not enough to accommodate a long via chain of the current embodiment, an alternative testline structure has to be employed. Testline 20 in FIG. 4 comprises a semiconductor substrate layer 5 and an insulating material 8 formed atop substrate layer 5, similar to those of the first embodiment as shown in FIG. 3. Testline 20 further includes a plurality of aligned probe pads 25 formed on the top surface of the insulating layer 8. A probe pad 25 has a flat, square metal surface with a dimension of about 45 μm by 45 μm and its opposing edges are either parallel or perpendicular to the testline edges. A probe pad 25 is separated from adjacent probe pads by insulating material 8 with pitch size of about 100 μm.

A via (1) chain 301 comprises a first M1 metal piece 301A formed in an insulating material 8 from a location beneath a first probe pad P1. Metal piece 301A extends horizontally about 0.5 μm in the longitudinal direction and its end is "viaed" up through a via (1) 33 to one end of a first M2 piece 301B of similar dimension in the second metal layer. 301B is "viaed" down on the other end through a second via (1) 33 to one end of a second M1 piece 301C, substantially the same as the first M1 piece 301A and the first M2 piece 301B. The other end of 301C, in turn, connects up to a second M2 piece through another vial. This zig-zag pattern continues in the space under a second probe pad P2 and a third probe pad P3 and extends longitudinally to a location beneath a fourth probe pad P4. The formed via chain 301 is electrically connected to probe pad P1 at one end through a stacking via structure 40A, which comprises an M2, M3, and M4 metal piece in a square shape formed in insulating layer 8 in a stacking configuration, and a plurality of vias 33 coupling said metal pieces. Preferably, the opposing edges of said metal pieces are either parallel or perpendicular to the testline edges. The other end of via chain 301 is electrically connected to probe pad P4 through a similar stacking via structure 40D.

Moreover, it can be seen from FIG. 4 that an MIM (metal-insulator-metal) capacitor 302 is formed between the third metal layer M3 and the fourth metal layer M4 in a test pattern area between a first probe pad P1 and a second probe pad P2, stacking over a first portion of via chain 301 formed between the first metal layer M1 and the second metal layer M2. MIM (metal-insulator-metal) capacitor 302 comprises a first metal plate 302A made of M3 and a second metal plate 302B made of M4. Plate 302A is electrically connected to an M3 piece of stacked via structure 40A, which is, in turn, connected to a first probe pad P1. Plate 302B is electrically connected to an M4 piece of stacked via structure 40B, which is, in turn, connected to a second probe pad P2. Capacitor 302 is electrically insulated from via chain 301 by insulating material 8 formed between M2 and M3 layers. Alternatively, other suitable metal/metal alloy materials such as aluminum (Al), copper (Cu), tungsten (W) can also be used to form capacitor plates 302A and 302B. Dielectric materials other than insulating material 8, such as silicon nitride ($Si_3N_4$), silicon carbide (SiC) or other high dielectric constant material may be used locally or at the wafer level to form a capacitor dielectric layer in order to obtain the desired capacitance.

Illustrated further in FIG. 4 is a bulky resistor 303 formed in the third metal layer M3 in a test pattern area between a second probe pad P2 and a third probe pad P3, stacking over a second portion of via chain 301, formed between the first metal layer M1 and the second metal layer M2. In the current embodiment, resistor 303 is formed by patterning a rectangular region of about 20 μm by 80 μm in M3. Each end of resistor 303 is electrically connected to an M3 piece of the stack via structure 40B and 40C, respectively, which in turn are coupled to probe pads P2 and P3. Additionally, formed in the test pattern area between a third probe pad P3 and a fourth probe pad P4 is a resistor 304 in the fourth metal layer in a serpentine configuration. One end of resistor 304 is electrically connected to an M4 piece of the stack via structure 40C. Resistor 304 extends transversely over a third portion of via chain 301 to an edge of testline 20, turns backwards, and extends along the next available routing grid to the other longitudinal edge of testline 20, passing nearly the entire width of the testline. This serpentine pattern repeats until it reaches a location under a fourth probe pad P4 and electrically connects to an M4 piece on the stack via structure 40D, which, in turn, is electrically coupled to probe pad P4. Resistors 303 and 304 are preferably made of copper in a rectangular and serpentine configuration, although other suitable metal or non-metal conductive materials, such as aluminum (Al), silver (Ag), tungsten (W), and polysilicon of various conductivities can also be used to form resistors of various shapes.

It can be well appreciated by those skilled in the art that the DUT arrangement in preferred embodiments disclosed above offers significant advantages on parametric testline space utilization. By forming DUTs under probe pad spaces and stacking DUTs in the insulating layer as shown in preferred embodiments, the total number of DUTs integrated in an embodied parametric testline can be significantly increased. Moreover, large size DUTs can fit in an embodied shrunk testline without altering device configurations.

In accordance with yet another embodiment of the current invention, there is shown in FIG. 5A a plan view of a parametric testline 120 having a line length of about 2000 μm, a line width of about 50 μm, and pitch dimension of about 100 μm, same as testline 20 shown in the previous embodiments. In the previous embodiments of FIG. 3 and FIG. 4, the probe pad 25 and the metal pieces on the underling stack via structure all have a square shape similar to that of a conventional parametric testline. The opposing edges of a probe pad 25 and the metal pieces are either parallel or perpendicular to the longitudinal edges of a testline. In the current embodiment, the probe pad 125 and the stacking via structure (see FIG. 5B) formed thereunder are rotated from the orientation of prior art and the previous embodiments such that the opposing edges of probe pad 125 and the opposing edges of the underlying metal piece 128 are not aligned with the longitudinal edges of a testline 120. For the purpose of clarity, only the uppermost metal layer M4 is shown in FIG. 5B, where via 133 connecting the conductive pad layer and the uppermost metal 4 layer can be seen in a sectional view. In a preferred embodiment, the probe pad 125, M4 piece 128 and metal pieces on other metal layers (not shown) are rotated approximately 45 degrees from the orientation of the parallel position of prior art. The area of the probe pad 125 and metal piece 128 are reduced, relative to a testline from previous embodiments, from approximately 2000 μm to about 1000 μm. The rotated pad 125 may have a corner-to-corner width of about 45 μm.

There is shown in FIG. 5A a square 135 with dashed edges on testline 120 between the corners of pad 1 and pad 2. Square 135 has a dimension of 45 μm by 45 μm and an area of about 2000 μm², same as a test pattern area on a testline 20 of the previous embodiments. By rotating a test pad and the underlying metal squares 45 degrees as shown in FIG. 5A, the available test pattern area between two adjacent probe pads is increased about 50% on each metal layer. FIG. 5B also illustrates a resistor 130 formed in the metal 4 layer in a serpentine configuration between pad 2 and pad 3, which can not otherwise be formed in a test pattern area between two adjacent probe pads of testlines of the previous embodiments.

Figure 6A:
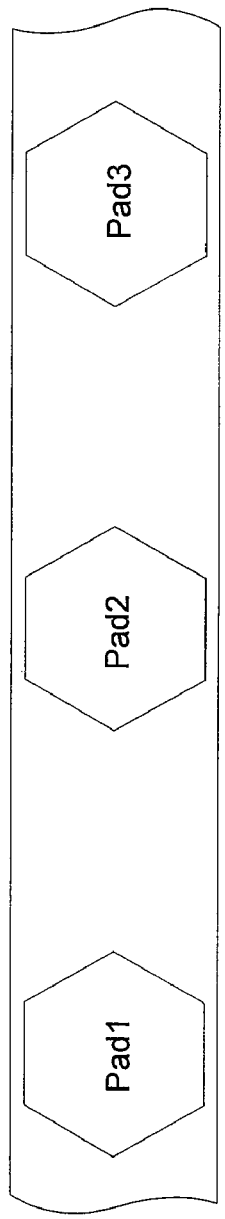
FIGS. 6A-6C illustrate plan views of a portion of further embodiments of the current invention.
Figure 6B:
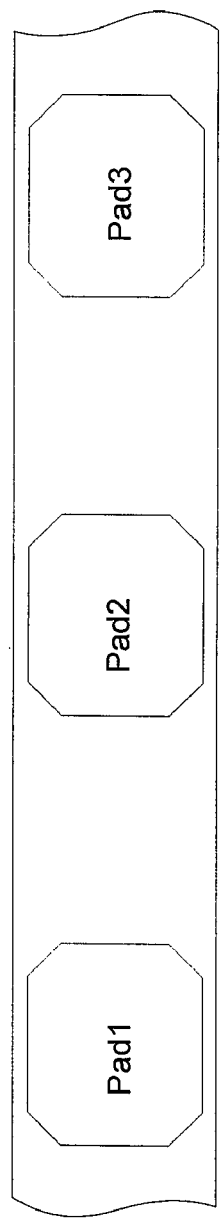
Figure 6C:
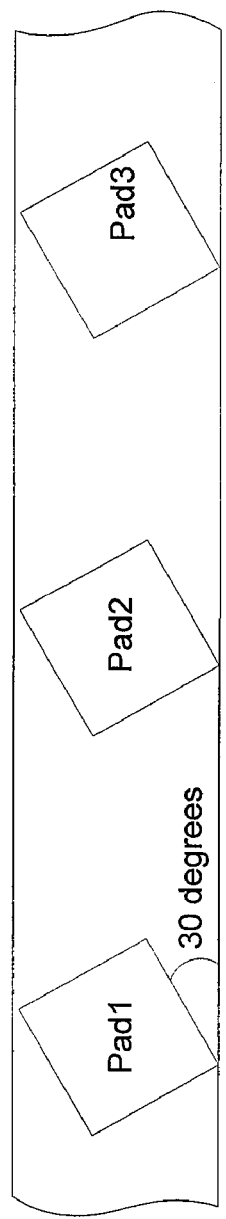

Although the preferred embodiments and their advantages have been described in detail, it should be understood by those skilled in the art that the parametric testline structures disclosed in preferred embodiments are merely exemplary to illustrate the inventive idea that test pattern areas can be formed in a testline space under probe pads in order to accommodate large size DUTs. DUTs in a parametric testline can be arranged in a stacking configuration to accommodate more DUTs on a testline, and the shape and orientation of a probe pad and the stacking via structure connected thereunder can be altered to provide more test pattern areas in a parametric testline with shrunk dimensions. Various changes, substitutions and alterations can be made herein without departing from the spirit and scope of the invention as defined by the appended claims. In further embodiments as shown in FIGS. 6A-6B, probe pads in a polygon shape, such as hexagonal or octagonal, are formed to provide increased test pattern areas between adjacent probe pads. In another embodiment as shown in FIG. 6C, probe pads are rotated 30 degrees from the orientation of prior art testlines in order to create extra test pattern areas between adjacent probe pads, while remaining in the scope of the present invention. In a yet further embodiment, a parametric testline comprises, among other features, a plurality of rotated probe pads, as disclosed in FIG. 5A, and test pattern areas formed in a testline space under a plurality of probe pads, as disclosed in FIGS. 3-4. A parametric testline combining those two features offers even more available test pattern areas compared to prior art testline structures and embodied testline structures as previously disclosed. In an even further embodiment, a parametric testline having a structure as disclosed above may be formed in a wafer die area for parametric, reliability and functional test, while remaining in the scope of the present invention.

Moreover, the scope of the present application is not intended to be limited to the particular embodiments of the process, machine, manufacture, composition of matter, means, methods and steps as described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit parametric testline structure comprising:
   a substrate;
   a dielectric layer formed atop said substrate;
   a first probe pad formed on said dielectric layer; and
   a first stacking via structure formed under and coupled to said first probe pad,
   wherein said first stacking via structure comprises a metal layer having an edge, said edge of said metal layer having a first line in a plane, said plane being parallel to a top surface of said substrate, and wherein edges of said parametric testline structure comprise respective second lines in said plane, said first line not being parallel to said second lines.

2. The testline structure in claim 1 further comprising a second probe pad and a third probe pad formed on said dielectric layer and a first device under test (DUT), wherein said first DUT is formed in said testline structure in a space underlying said first probe pad, second probe pad, and third probe pad.

3. The testline structure in claim 2 further comprising a second device under test (DUT), said second DUT is formed in said testline structure in a space underlying said first and said second probe pads overlying said first DUT.

4. The testline structure in claim 1 wherein said first probe pad has a polygon shape selected from the group consisting of square, rectangular, hexagonal, octagonal, circular, and elliptical.

5. A testline structure comprising:
   a first probe pad on a top surface of a dielectric layer;
   a first stacking structure under said top surface of said dielectric layer and coupled to said first probe pad; and
   a first device under test (DUT) coupled to said first stacking structure, wherein a first portion of said first DUT directly underlies a first area of said top surface of said dielectric layer, wherein said first area is enclosed by a first line along an edge of said first probe pad, a second line along a longitudinal edge of said testline structure, and a third line perpendicular to said longitudinal edge.

6. The testline structure of claim 5, further comprising:
   a second probe pad on said top surface of said dielectric layer; and
   a second stacking structure under said top surface of said dielectric layer and coupled to said second probe pad, wherein said first DUT is coupled to said second stacking structure.

7. The testline structure of claim 6, wherein a second portion of said first DUT directly underlies a second area of said top surface of said dielectric layer, wherein said second area is defined by an edge of said second probe pad, said longitudinal edge of said testline structure, and a second line perpendicular to said longitudinal edge.

8. The testline structure of claim 6, further comprising:
   a third probe pad on said top surface of said dielectric layer;
   a third stacking structure under said top surface of said dielectric layer; and
   a second DUT coupled to said first stacking structure and to said third stacking structure, wherein said second DUT directly underlies said second stacking structure.

9. The testline structure of claim 5, further comprising a substrate, wherein said dielectric layer is over said substrate.

10. The testline structure of claim 9, wherein said substrate comprises a semiconductor material selected from the group consisting essentially of silicon, silicon germanium, gallium arsenide, indium phosphide, and combinations thereof.

11. The testline structure of claim 9, wherein said first DUT is disposed in said substrate.

12. The testline structure of claim 5, wherein said first DUT is disposed in said dielectric layer.

13. A testline structure comprising:
   a first probe pad on a top surface of a dielectric layer;
   a second probe pad on said top surface of said dielectric layer;
   a first stacking structure under said top surface of said dielectric layer and coupled to said first probe pad;
   a second stacking structure under said top surface of said dielectric layer and coupled to said second probe pad; and
   a first device under test (DUT) coupled to said first stacking structure and said second stacking structure, wherein a first portion of said first DUT is outside of an area parallel to said top surface of said dielectric layer and defined by longitudinal boundaries of said testline structure and boundaries perpendicular to said longitudinal boundaries, wherein said boundaries perpendicular to said longitudinal boundaries each intersect a point on one of said first stacking structure and said second stacking structure, and wherein a second portion of said first DUT is inside said area.

14. The testline structure of claim 13, further comprising:
   a third probe pad on said top surface of said dielectric layer;
   a third stacking structure under said top surface of said dielectric layer; and
   a second DUT coupled to said first stacking structure and to said third stacking structure, wherein said second DUT directly underlies said second stacking structure.

15. The testline structure of claim 13, further comprising a substrate, wherein said dielectric layer is over said substrate.

16. The testline structure of claim 15, wherein said substrate comprises a semiconductor material selected from the group consisting essentially of silicon, silicon germanium, gallium arsenide, indium phosphide, and combinations thereof.

17. The testline structure of claim 15, wherein said first DUT is disposed in said substrate.

18. The testline structure of claim 13, wherein said first DUT is disposed in said dielectric layer.

19. The testline structure of claim 13, wherein said dielectric layer comprises a material selected from the group consisting essentially of silicon dioxide ($SiO_2$), silicon carbide (SiC), silicon nitride ($Si_3N_4$), and combinations thereof.

20. The testline structure of claim 13, wherein said first DUT comprises a device selected from the group consisting essentially of MOS devices, field MOS devices, diode devices, capacitors, resistors, inductors, contact/via chains, gate/field dielectric integrity devices, reliability devices, memory devices, and combinations thereof.

* * * * *